US009945695B2

United States Patent
Fusare

(10) Patent No.: US 9,945,695 B2
(45) Date of Patent: Apr. 17, 2018

(54) PROXIMITY SENSOR

(71) Applicant: Simmonds Precision Products, Inc., Vergennes, VT (US)

(72) Inventor: Scott Fusare, Burlington, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 151 days.

(21) Appl. No.: 14/717,460

(22) Filed: May 20, 2015

(65) Prior Publication Data
US 2016/0341572 A1 Nov. 24, 2016

(51) Int. Cl.
*G01D 5/20* (2006.01)
*G01B 7/00* (2006.01)
*G01B 7/14* (2006.01)
*H03K 17/95* (2006.01)

(52) U.S. Cl.
CPC ............ *G01D 5/20* (2013.01); *G01B 7/00* (2013.01); *G01B 7/14* (2013.01); *H03K 17/954* (2013.01)

(58) Field of Classification Search
CPC ... G01B 7/00; G01B 7/14; G01D 5/20; H03K 17/954
See application file for complete search history.

(56) References Cited

U.S. PATENT DOCUMENTS

| 3,484,787 | A | * | 12/1969 | Vallese | H01Q 9/42 343/751 |
| 3,609,527 | A | | 9/1971 | Ellis | |
| 4,005,359 | A | * | 1/1977 | Smoot | G01B 7/105 324/230 |
| 5,515,041 | A | * | 5/1996 | Spillman, Jr. | G08C 17/04 340/870.05 |
| 8,188,730 | B2 | | 5/2012 | Gong et al. | |
| 8,258,777 | B2 | | 9/2012 | Chen | |
| 8,271,218 | B2 | | 9/2012 | Colinet et al. | |
| 2004/0194532 | A1 | * | 10/2004 | Lally | G01D 3/08 73/1.82 |
| 2005/0007239 | A1 | | 1/2005 | Woodard et al. | |

(Continued)

FOREIGN PATENT DOCUMENTS

WO  WO 2014156276 A1 * 10/2014 ............ G01B 7/023

OTHER PUBLICATIONS

WO 2014/156276 A1—English translation.*
Extended European Search Report for EP Application No. 16170295.6, dated Oct. 14, 2016, 7 pages.

*Primary Examiner* — Patrick Assouad
*Assistant Examiner* — Haidong Zhang
(74) *Attorney, Agent, or Firm* — Kinney & Lange, P.A.

(57) ABSTRACT

A proximity sensor includes an active sensor, a passive target, and a measurement circuit. The active sensor includes an active resonant tank circuit that includes an excitation source, a first capacitor, and a first inductor. The passive target includes a passive resonant tank circuit that includes a second capacitor and a second inductor, where magnetic coupling between the first inductor and the second inductor varies as a function of physical displacement of the first inductor and the second inductor with respect to one another. The measurement circuit is configured to measure a coupled resonant frequency response in the active resonant tank circuit and provide a measured distance output based on the coupled resonant frequency response.

20 Claims, 4 Drawing Sheets

(56) References Cited

U.S. PATENT DOCUMENTS

2007/0247700 A1* 10/2007 Makowski ............. G09B 19/00 359/322
2013/0271158 A1* 10/2013 Thoss ...................... G01B 7/14 324/654

* cited by examiner

PROXIMITY SENSOR

BACKGROUND

Proximity sensing devices are devices that produce an output based upon a distance between two or more sensors or objects. Proximity sensors typically contain electrical circuits having an electrical, mechanical, or optical distance sensing portion. Electromechanical sensors are often used to establish contact between two objects, such as an end switch, and electrical sensors are frequently used when a distance measurement is desired. Electrical proximity sensors commonly include inductance sensors, which rely on unique electrical properties of inductance circuits to detect the proximity of a target object.

Proximity sensors are prevalent in several industries, such as process management, automotive, and aviation. Their applications span a large range from traffic control to linkage actuation control. For example, proximity sensing devices are an integral and indispensable component of a modern aircraft. Knowledge that a moving surface has reached a particular location in its travel can promote proper and safe operation of various aircraft systems.

SUMMARY

In one embodiment, a proximity sensor includes an active sensor, a passive target, and a measurement circuit. The active sensor includes an active resonant tank circuit that includes an excitation source, a first capacitor, and a first inductor. The passive target includes a passive resonant tank circuit that includes a second capacitor and a second inductor, where magnetic coupling between the first inductor and the second inductor varies as a function of physical displacement of the first inductor and the second inductor with respect to one another. The measurement circuit is configured to measure a coupled resonant frequency response in the active resonant tank circuit and provide a measured distance output based on the coupled resonant frequency response.

In another embodiment, a proximity sensor system includes a proximity sensor and a controller. The proximity sensor includes an active sensor, a passive target, and a measurement circuit. The active sensor includes an active resonant tank circuit that includes an excitation source, a first capacitor, and a first inductor. The passive target includes a passive resonant tank circuit that includes a second capacitor and a second inductor, where magnetic coupling between the first inductor and the second inductor varies as a function of physical displacement of the first inductor and the second inductor with respect to one another. The measurement circuit is configured to measure a coupled resonant frequency response in the active resonant tank circuit and provide a measured distance output based on the coupled resonant frequency response. The controller is connected to the measurement circuit for controlling a system component based on the measured distance output.

In another embodiment, a method of sensing proximity includes powering an active sensor, measuring a coupled resonant frequency response, and producing a measured distance output based on the electrical response. The active sensor is powered, which includes an active resonant tank circuit, and is magnetically coupled to a passive resonant tank circuit of a passive target. The magnetic coupling between the active resonant tank circuit and the passive resonant tank circuit varies as a function of physical displacement between the active and passive resonant tank circuits with respect to one another. A coupled resonant frequency response is measured in the active circuit that is a function of the magnetic coupling between the active resonant tank circuit and the passive resonant tank circuit. A measured distance output is produced based on the coupled resonant frequency response.

DETAILED DESCRIPTION

Figure 1:
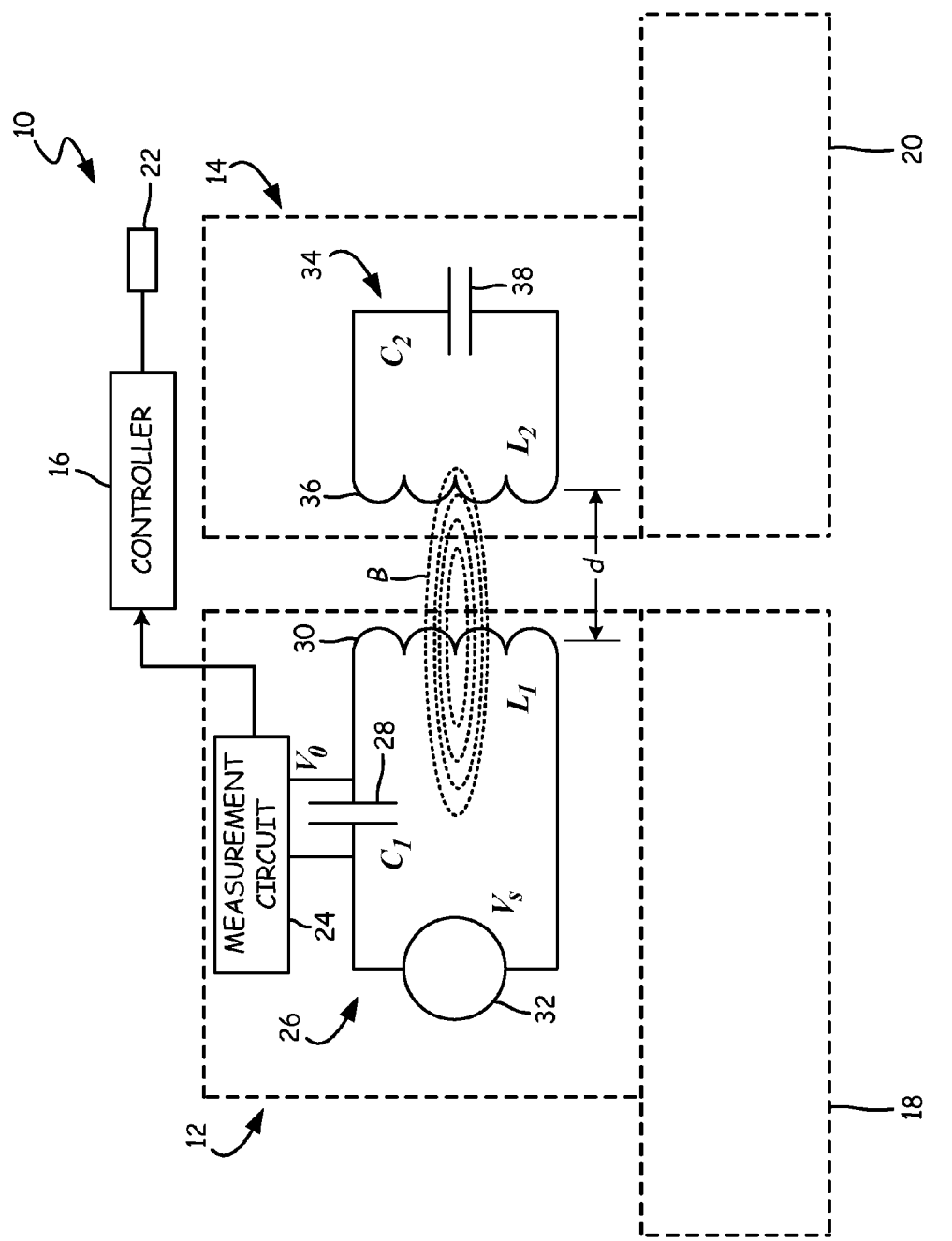
FIG. 1 is a schematic view of a proximity sensor system.

FIG. 1 is a schematic view of proximity sensor system 10, which includes active sensor 12, passive target 14, controller 16, first structure 18, second structure 20, and system components 22. Active sensor 12 includes measurement circuit 24 and active resonant tank circuit 26. Active resonant tank circuit 26 includes capacitor 28, inductor 30, and excitation source 32. Passive target 14 includes passive resonant tank circuit 34, which includes inductor 36 and capacitor 38. Also shown in FIG. 1 are distance d, capacitance $C_1$, capacitance $C_2$, inductance $L_1$, Inductance $L_2$, drive signal voltage $V_s$, sensor output voltage $V_o$, and magnetic field B.

Active sensor 12 is physically connected to first structure 18 by welding, riveting, screwing, co-molding, or another fastening means. Also, active sensor 12 can be enclosed by a housing (not shown) which can then be attached to first structure 18. Similarly, passive target 14 is physically connected to second structure 20 by welding, riveting, screwing, co-molding, or another fastening means. Also, passive target 14 can be enclosed by a housing (not shown) which can then be attached to second structure 20. Active sensor 12 and passive target 14 are fixed to first structure 18 and second structure 20, respectively. However, active sensor 12 and passive target 14 can move relative to one another, as first structure 18 and second structure 20 can move with respect to each other. Distance d represents the physical distance between inductor 30 and inductor 36. Because inductor 30 is a component of active sensor 12, which is attached to first structure 18, distance d between inductors 30 and 36 can be easily correlated to other distances, such as a distance between active sensor 12 and passive target 14, and their respective components. In one example, first structure 18 and second structure 20 can be connected to each other but still free to move relative to each other, for example as parts of a linkage assembly.

Measurement circuit 24 can be physically attached to first structure 18 by welding, riveting, screwing, co-molding, or another fastening means. Additionally, measurement 24 can be on a common printed circuit board with active sensor 12 or can otherwise be integrated into active sensor 12. For example, measurement circuit 24 and active resonant tank circuit 26 can be within a common housing within active sensor 12. Controller 16 can be mounted to first structure 18 or second structure 20; however, in many examples controller 16 can be mounted physically remotely from first structure 18 and second structure 20.

Capacitor 28 of active resonant tank circuit 26 is electrically connected in series with inductor 30 and excitation source 32. Capacitor 28 has a capacitance $C_1$, and inductor 30 has an inductance $L_1$. Excitation source 32 produces a drive signal voltage Vs.

Capacitor 38 of passive resonant tank circuit 34 is connected with inductor 36 in parallel. Capacitor 38 has a capacitance $C_2$, and inductor 36 has an inductance $L_2$. Capacitors 28 and 38 can be a ceramic capacitor, film capacitor, or any type of capacitor capable of storing electrical energy and having sufficient quality factor Q to operate effectively in a resonant circuit. Inductors 30 and 36 can be a ferromagnetic inductor, an air core inductor, or any other type of inductor having sufficient quality factor Q to operate effectively in a resonant circuit. Excitation source 32 can be an alternating current (AC) power supply for producing a current or excitation pulse.

Active resonant tank circuit 26 and its components create an active series resonator circuit, also known as a tank circuit, resonant circuit, or tuned circuit. Passive resonant tank circuit 34 and its components create a passive parallel resonator circuit, also known as a tank circuit, resonant circuit, or tuned circuit.

Measurement circuit 24 is connected to active resonant tank circuit 26 across capacitor 28. Measurement circuit 24 measures sensor output voltage $V_o$. Measurement circuit 24 is also electrically connected to controller 16, which further electrically connects to system components 22. System components 22 can be any system component capable of being moved or articulated. For example, first structure 18 and second structure 20 could be system components 22.

In operation of one embodiment, excitation source 32 sends a current to capacitor 28, which stores charge and ultimately discharges the current to inductor 30. Inductor 30, in response, creates magnetic field B, which oscillates in response to the alternating current. Excitation source 32 provides continuous power to active resonant tank circuit 26 creating continuous oscillations of magnetic field B at the natural frequency of active resonant tank circuit 26, creating resonance.

Passive resonant tank circuit 34 is tuned to the same or similar resonant frequency of active circuit 32, where the product of capacitor 28 and inductor 30 can be approximately equal to the product of capacitor 38 and inductor 36. When passive resonant tank circuit 34 is within range of magnetic field B, passive resonant tank circuit 34 and active resonant tank circuit 26 become magnetically coupled. When coupled, magnetic field B will induce a current through inductor 36, which will flow in passive resonant tank circuit 34. In response to this current flow, Lenz's law dictates that inductor 36 will produce a magnetic field in a direction opposite of that created by inductor 30. The magnetic field response by inductor 36 is received by inductor 30 of active resonant tank circuit 26. The reflected load can create a coupled resonant frequency response $f_{c1}$, or an electrical response, in active resonant tank circuit 26.

The electrical response in active resonant tank circuit 26 is detectable by measuring and analyzing the current through or the voltage across a component of active resonant tank circuit 26. In one example, measurement circuit 24 measures the voltage across capacitor 28 to observe coupled resonant frequency responses $f_{c1}$ and $f_{c2}$ through active resonant tank circuit 26. In other embodiments, measurement circuit 24 can measure the voltage across any component of active resonant tank circuit 26. Measurement circuit 24 can include an oscillator, demodulator, and other components to obtain an accurate measurement of coupled resonant frequency responses $f_{c1}$ and $f_{c2}$.

In designs of active resonant tank circuit 26 and passive resonant tank circuit 34, a unique, easily detectable response can be observed through a measurement of coupled resonant frequency response $f_{c1}$; however, for the response to be unique, easily detectable, and useful as a proximity sensor, some conditions can be met. The first condition is that a circuit quality factor Q is greater than 1 for both circuits, or:

$$Q_1 > 1 \text{ and } Q_2 > 1 \tag{Eq. 1A}$$

Where $Q_1$ is the quality factor of active resonant tank circuit 26 and $Q_2$ is the quality factor of passive resonant tank circuit 34. However, it is preferred that quality factors $Q_1$ and $Q_2$ are much greater than one (in many embodiments, at least one order of magnitude, i.e. ten times greater), or:

$$Q_1 \gg 1 \text{ and } Q_2 \gg 1 \tag{Eq. 1B}$$

The quality factor of active resonant tank circuit 26 is given by the equation $$Q_1 = \frac{1}{R_1} * \sqrt{\frac{L_1}{C_1}} \tag{Eq. 2A}$$

Where $R_1$ is the resistance of active resonant tank circuit 26. The quality factor of passive resonant tank circuit 34 is given by the equation $$Q_2 = R_2 * \sqrt{\frac{C_2}{L_2}} \tag{Eq. 2B}$$

Where $R_2$ is the resistance of passive resonant tank circuit 34. In some embodiments, $R_1$ and $R_2$ can be only the parasitic resistance of their respective circuit, because the circuit contains no added resistor component, as it is desired to maintain a high quality factor in each circuit.

A second condition that can be met is that resonant frequencies or both circuits $f_{R1}$ and of $f_{R2}$ can be approximately equal. The resonant frequency for each circuit is determined by the equations:

$$f_{R1} = \frac{1}{2\pi\sqrt{L_1 * C_1}} \tag{Eq. 3A}$$

$$f_{R2} = \frac{1}{2\pi\sqrt{L_2 * C_2}} \tag{Eq. 3B}$$

Because the resonant frequency for each circuit is dependent primarily on that circuits' inductance and capacitance, especially in some embodiments, when quality factors $Q_1$ and $Q_2$ are much greater than one, the product of the inductance and capacitance of each circuit must be approximately equal to that of the other circuit, or:

$$L_1 * C_1 \approx L_2 * C_2 \tag{Eq. 4}$$

The third condition that can be met is that a coefficient of coupling k between active resonant tank circuit 26 and passive resonant tank circuit 34 can be greater than a critical coefficient of coupling $k_c$ between active resonant tank circuit 26 and passive resonant tank circuit 34. The coefficient of coupling k is the magnetic coupling coefficient between circuits, which ranges from zero to one, or $0 \leq k \leq 1$, and is defined by $$k = \frac{M}{\sqrt{L_1 * L_2}} \quad \text{(Eq. 5)}$$

Where M is the mutual inductance of inductors $L_1$ and $L_2$ or inductors 30 and 36. The mutual inductance M of inductors 30 and 36 correlates directly and varies with distance d.

The critical coefficient of coupling $k_c$ between active resonant tank circuit 26 and passive resonant tank circuit 34 is given as $$k_c = \frac{1}{\sqrt{Q_1 * Q_2}} \quad \text{(Eq. 6)}$$

Therefore, the third condition can become $$\frac{M}{\sqrt{L_1 * L_2}} > \frac{1}{\sqrt{Q_1 * Q_2}} \quad \text{(Eq. 7)}$$

In an exemplary embodiment, the coupled resonant frequency responses $f_{c1}$ and $f_{c2}$ of active resonant tank circuit 26 and the passive resonant tank circuit 34 can be determined by the equations $$f_{c1} = \frac{f_{R2}}{\sqrt{1+k}} \quad \text{(Eq. 8A)}$$

$$f_{c2} = \frac{f_{R2}}{\sqrt{1-k}} \quad \text{(Eq. 8A)}$$

Here, the coupled resonant frequency responses $f_{c1}$ and $f_{c2}$ of active resonant tank circuit 26 and passive resonant tank circuit 34, respectively, are dependent only on the uncoupled resonant frequencies $f_{R1}$ and $f_{R2}$, respectively, and the coefficient of coupling k between active resonant tank circuit 26 and passive resonant tank circuit 34. Because the uncoupled resonant frequency will be fixed by the inductance L and capacitance C of each circuit, the coupled resonant frequency responses $f_{c1}$ and $f_{c2}$ are primarily dependent on the coefficient of coupling k. For example, the coupled resonant frequency response $f_{c1}$ of active resonant tank circuit 26 is primarily dependent on the coefficient of coupling k between active resonant tank circuit 26 and passive resonant tank circuit 34. The coefficient of coupling k between active resonant tank circuit 26 and passive resonant tank circuit 34 is given by Equation 5 above, where M is the mutual inductance of inductors $L_1$ and $L_2$ or inductors 30 and 36. The mutual inductance M of inductors 30 and 36 is primarily dependent on distance d, the distance between inductors 30 and 36. This means the coefficient of coupling k is primarily dependent on distance d, and that the coupled resonant frequency responses $f_{c1}$ and $f_{c2}$ are then primarily dependent on distance d. Therefore, with active resonant tank circuit 26 and passive resonant tank circuit 34 meeting the exemplary conditions, the electrical response, or the coupled resonant frequency response $f_{c1}$, in active resonant tank circuit 26 caused by an interaction with passive resonant tank circuit 34 becomes a function primarily dependent on distance d between inductors 30 and 36.

Thus, the coupled resonant frequency response $f_{c1}$, or electrical response, can be measured by measurement circuit 24 and transformed into a measured distance output to be used by, for example, controller 16. Essentially, active resonant tank circuit 26 and passive resonant tank circuit 34 to be used to sense proximity or distance. Further, with sufficient physical information regarding active sensor 12 and its components and passive target 14 and its components, the electrical response can be correlated to the separation in distance d between active sensor 12 and passive target 14.

Distance d represents the physical distance between inductor 30 and inductor 36. Because inductor is a component of active sensor 12 and inductor 36 is a component of first structure 18, distance d between inductors 30 and 36 can be easily correlated to other distances between active sensor 12 and first structure 18, and their respective components.

The prior art includes proximity sensors that can include an active tank circuit of an active sensor and a ferromagnetic passive target. While a ferromagnetic target does produce an electrical response in the active circuit by affecting the magnetic field of the tank circuit's inductor, the application has some drawbacks. First, these sensors can have a small physical operating range, or struggle to operate over a large distance d. This imposes tight calibration requirements to allow the desired signal to be detected by the active sensor. Therefore, the electronic signature produced by this type of system can, in some examples, vary by only a few percent between a near condition (when the target is very close to the active sensor) and the far condition (when the target is relatively distant from the active sensor). Further, because the active sensor is designed to interact with ferromagnetic passive targets impacting the magnetic field of the active circuit, the circuit is susceptible to ambient noise and interference. To account for such interference, can require a complicated design of the signal conditioning and measurement electronics interacting with the active portion of the sensor. This can increase the cost and complexity of the devices.

This disclosure addresses these issues by using specifically designed coupled resonators, which produce a unique electrical response, as described in more detail below, when active resonant tank circuit 26 and passive resonant tank circuit 34 are magnetically coupled. Because the electrical response in active resonant tank circuit 26 is a coupled resonant frequency response $f_{c1}$ it is a function of distance d between inductors 30 and 36, and it is more easily detected and determined by measurement circuit 24. This is particularly helpful at large distances between active resonant tank circuit 26 and passive resonant tank circuit 34, when noise is more likely to impact the detected signal, because noise may not disturb the change in coupled frequency responses $f_{c1}$ and $f_{c2}$. This permits detection to occur at greater distances. This also permits finer resolution of the detection of distance d, which leads to a higher measurement accuracy. This is all accomplished while maintaining the simplicity of using a passive target circuit, which provides the benefit of being robust.

Figure 2:
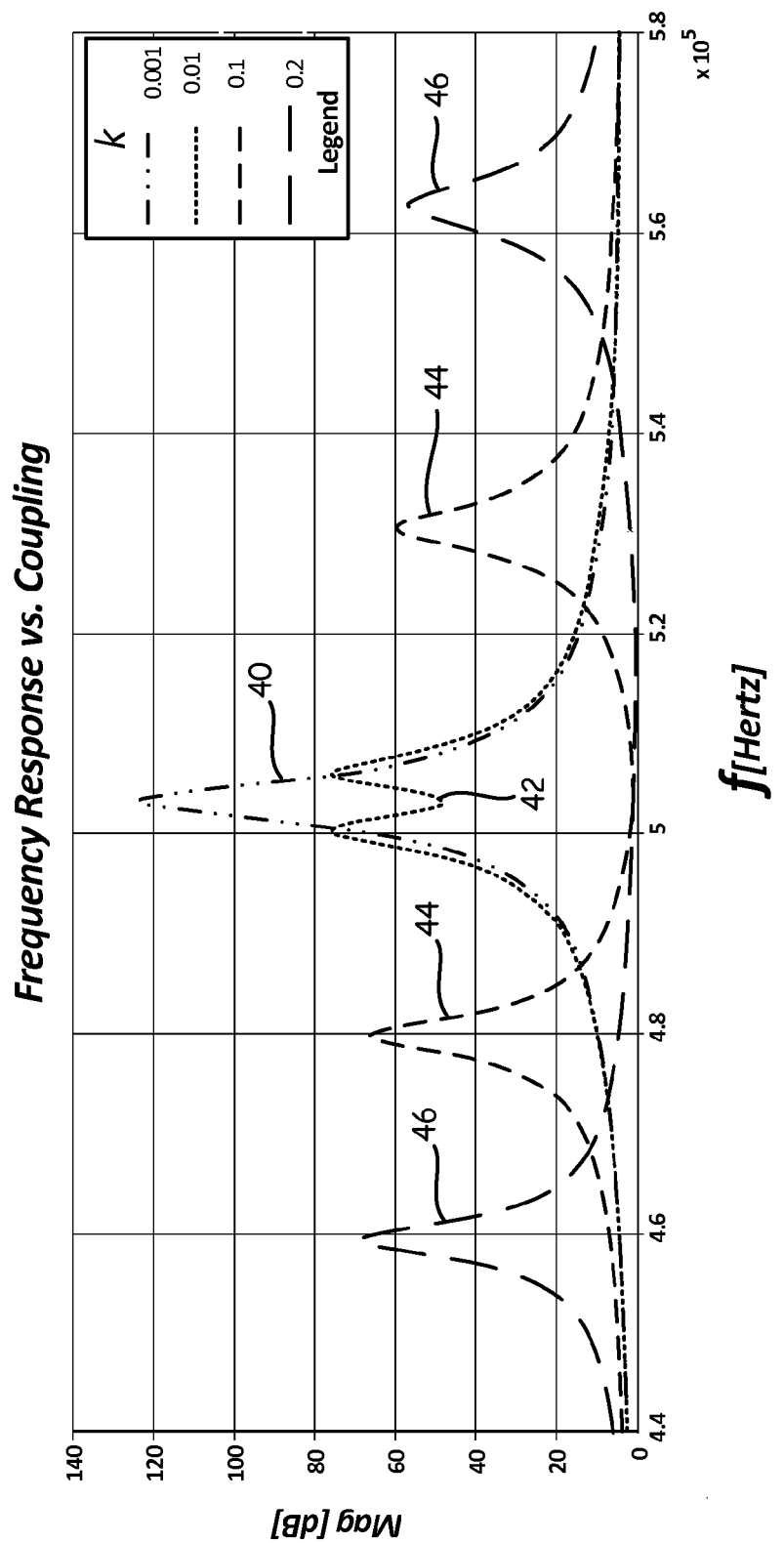
FIG. 2 is a graph illustrating frequency response versus magnetic coupling of a coupled resonator of the proximity sensor system of FIG. 1.

FIG. 2 is a graph illustrating one embodiment of frequency response versus the coefficient of coupling k of active resonant tank circuit 26 and passive resonant tank circuit 34 FIG. 1. Frequency f is displayed on the x-axis of the graph and magnitude Mag is displayed on the y-axis of the graph. Also displayed on the graph are four response curves, curve 40, curve 42, curve 44, and curve 46.

Magnitude Mag has a range on the y-axis of 0 decibels (dB) to magnitude Mag of 140 dB, with intermediate markers along the y-axis denoting steps of 20 dB. Frequency f moves from the left to the right side of its axis, ranging from $4.4 \times 10^5$ Hertz (Hz) to $5.8 \times 10^5$ Hz at its maximum, with increments of $0.2 \times 10^5$ Hz denoted.

The graph legend displays the corresponding values of coefficient of coupling k to curves 40, 42, 44, and 46. Specifically, curve 40 is a response curve where the coefficient of coupling k between active resonant tank circuit 26 and passive resonant tank circuit 34 is 0.001, curve 42 is a response curve where the coefficient of coupling k between active resonant tank circuit 26 and passive resonant tank circuit 34 is 0.01, curve 44 is a response curve where the coefficient between coupling k of active resonant tank circuit 26 and passive resonant tank circuit 34 is 0.1, and curve 46 is a response curve where the coefficient of coupling k between active resonant tank circuit 26 and passive resonant tank circuit 34 is 0.2. Detecting or observing these responses in active resonant tank circuit 26 can be performed using any standard technique.

Curves 40, 42, 44, and 46 represent the signature of the electrical response signal in active resonant tank circuit 26 based on the coefficient of coupling k, showing how much of the signal is within each frequency. Curve 40, which represents a coefficient of coupling k of 0.001, has a single discernable resonant frequency signature having a single peak amplitude in the displayed range. Curve 40 displays a frequency response having a coefficient of coupling k of 0.001, which is so low that the coupled frequency responses $f_{c1}$ and $f_{c2}$ are nearly equal to resonant frequency $f_{R1}$ of active resonant tank circuit 26. This is given by the equation:

$$f_{c1} \approx f_{c2} \approx f_{R1} \qquad \text{(Eq. 9)}$$

Curve 42, which represents a coefficient of coupling k of 0.01, depicts a curve showing a split frequency response. Curve 42 has a signature having coupled frequency responses $f_{c1}$ and $f_{c2}$ separated by $0.05 \times 10^5$ Hz as curve 42 has a split peak amplitude (or double hump curve), having a trough at the same frequency of the peak of curve 40. The coupled frequency response $f_{c1}$ of curve 42 occurs at approximately $5.0 \times 10^5$ Hz and coupled frequency response $f_{c2}$ occurs at approximately $5.05 \times 10^5$ Hz.

Curve 44, which represents a coefficient of coupling k of 0.1, has a signature with coupled frequency responses $f_{c1}$ and $f_{c2}$ at approximately $4.8 \times 10^5$ Hz and $5.3 \times 10^5$ Hz. The separation in peaks of curve 44 is $0.5 \times 10^5$ Hz, which is significantly greater than the separation between peaks in curve 42, which is approximately $0.05 \times 10^5$ Hz. This resonant frequency response separation effect is even greater in curve 46, which has peaks at approximately $4.6 \times 10^5$ Hz and $5.65 \times 10^5$ Hz. Also, the magnitudes of the peaks in curve 46 differ. The magnitude of the $4.6 \times 10^5$ Hz peak is approximately 70 dB, while the magnitude of the $5.65 \times 10^5$ Hz peak is approximately 58 dB, a difference of 12 dB. Curve 44 has a difference of approximately 3 dB in peak magnitude.

Other signatures of signals having a coefficient of coupling k between 0.001 and 0.2, though not shown, will also vary, as will the signatures of electrical response signals greater than a coefficient of coupling k of 0.2. These differences in curves 40, 42, 44, and 46, as well as those with other coefficients of coupling k, are apparent and easily detectable, even at low coefficients of coupling k, such as 0.01. Because the differences between curves 40, 42, 44, and 46 are readily discernible when the components of active resonant tank circuit 26 and passive resonant tank circuit 34 are designed in accordance with exemplary embodiments, these response signatures can be easily mapped to their coefficients of coupling k. Then, when a response is observed it can be correlated to a coefficient of coupling k, which can then be translated into a distance between inductors 30 and 36, allowing for proximity detection to be easily performed.

In one embodiment, distance d between components of active resonant tank circuit 26 and passive resonant tank circuit 34 can be determined based on its proportionality to the distance, or the difference, between the coupled frequency responses $f_{c1}$ and $f_{c2}$. This is given by equations:

$$|f_{c1} - f_{c2}| \propto \frac{1}{d} \qquad \text{(Eq. 10A)}$$

$$f_{c2} - f_{c1} \propto \frac{1}{d} \qquad \text{(Eq. 10B)}$$

In another embodiment, distance d between components of active resonant tank circuit 26 and passive resonant tank circuit 34 can be determined based on its proportionality to the difference or distance between either coupled frequency response $f_{c1}$ and $f_{c2}$ and resonant frequency $f_{R1}$ of active resonant tank circuit 26, given by equations:

$$f_{R1} - f_{c1} \propto \frac{1}{d} \qquad \text{(Eq. 11A)}$$

$$f_{c1} - f_{R1} \propto \frac{1}{d} \qquad \text{(Eq. 11B)}$$

Though specific values are shown in FIG. 2, a frequency response can be over many frequency ranges and many magnitude ranges.

FIGS. 3A-3D are graphs of four embodiments illustrating time domain responses versus the coefficient of coupling k of active resonant tank circuit 26 and passive resonant tank circuit 34 of FIG. 1. FIGS. 3A-3D are discussed concurrently. In FIGS. 3A-3D time t is displayed on the x-axis of each graph and magnitude Mag is displayed on the y-axis of each graph. Time t ranges from 0 seconds to $2.5 \times 10^{-4}$ seconds at its maximum, with increments of $0.5 \times 10^{-4}$ seconds denoted. The magnitude mag spans from −20 dB to 20 dB on the y-axis, with intermediate markers denoting steps of 5 dB.

Figure 3A:
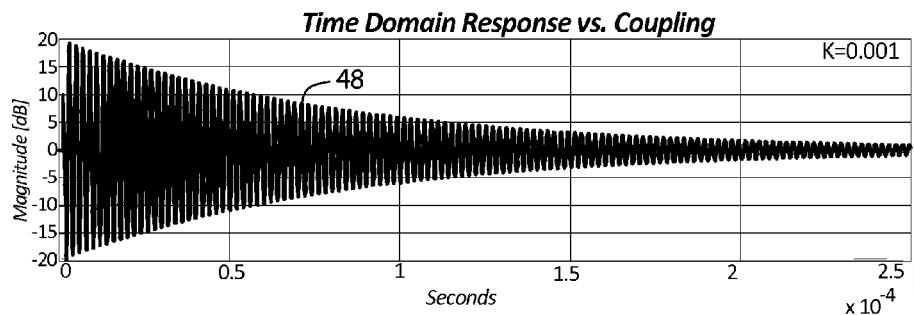
FIGS. 3A-3D are graphs illustrating time domain response versus magnetic coupling of a coupled resonator of the proximity sensor system of FIG. 1.
Figure 3B:
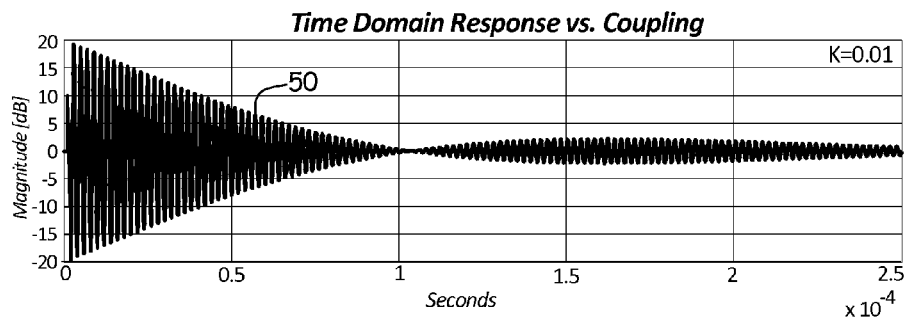
Figure 3C:
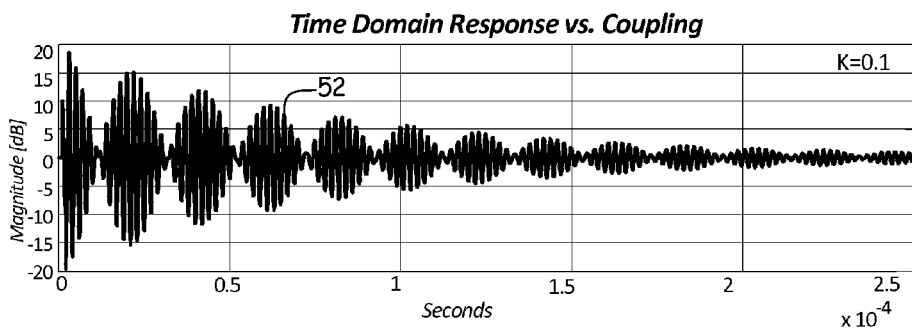
Figure 3D:
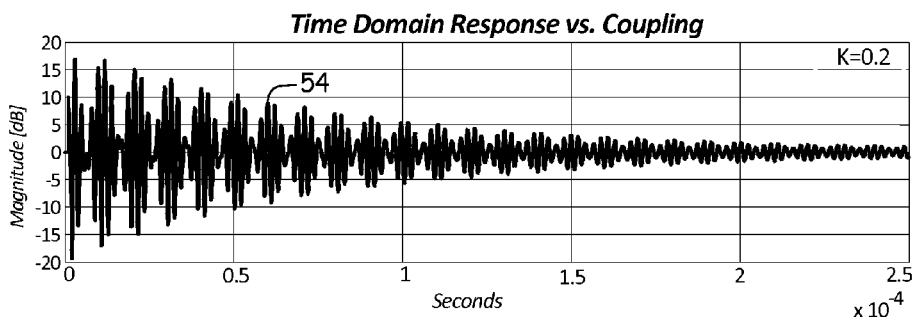

FIGS. 3A-3D display a time domain response of an impulse excitation measured in active resonant tank circuit 26. Each of FIGS. 3A-3D displays a response at a different coefficient of coupling k between active resonant tank circuit 26 and passive resonant tank circuit 34. Specifically, FIG. 3A shows response curve 48 where the coefficient of coupling k between active resonant tank circuit 26 and passive resonant tank circuit 34 is 0.001. FIG. 3B shows response curve 50 where the coefficient of coupling k between active resonant tank circuit 26 and passive resonant tank circuit 34 is 0.01. FIG. 3C shows response curve 52 where the coefficient between coupling k of active resonant tank circuit 26 and passive resonant tank circuit 34 is 0.1, and FIG. 3D shows response curve 54 where the coefficient between coupling k of active resonant tank circuit 26 and passive resonant tank circuit 34 is 0.2.

Curves 48, 50, 52, and 54 vary significantly in their signature in many ways. The amplitude of curve 48 begins at approximately 40 dB and slowly decays to near 0 dB over the time domain while its frequency remains constant. The amplitude of curve 50 begins at approximately 40 dB and decays to nearly 0 dB at $1\times10^{-4}$ seconds before beginning to increase again. The amplitude of curve 52 decays quickly and then rapidly increases, but its original amplitude decreases in each successive cycle, decaying with time as it oscillates. Curve 54 is similar to curve 52, but the amplitude cycle of curve 52 occurs at a higher frequency than that of curve 54.

Other signatures of signals having a coefficient of coupling k between 0.001 and 0.2, though not shown, will also vary, as will the signatures of signals greater than a coefficient of coupling k of 0.2. These differences in curves 48-54, as well as those with other coefficients of coupling k, are apparent and easily detectable, even at low coefficients of coupling k, such as 0.01. Because the differences between curves 48-54 are readily discernible when the components of active resonant tank circuit 26 and passive resonant tank circuit 34 are designed in accordance with exemplary embodiments, these response signatures can be easily mapped to their coefficients of coupling k. Then, when a response is observed by analyzing its waveform from a pulse excitation, it can be correlated to a coefficient of coupling k, which can then be translated into a distance between inductors 30 and 36, allowing for proximity detection to be easily performed.

In one embodiment, distance d between components of active resonant tank circuit 26 and passive resonant tank circuit 34 can be determined using an envelope detection method, where the detected frequency $f_{det}$ is proportional to the coefficient of coupling k and distance d. In one embodiment, detected frequency $f_{det}$ increases as the coefficient of coupling k increases.

In another embodiment, a Fourier transform can be performed on the detected curve, where the resultant curve, or data set, can be analyzed in the frequency domain as described in FIG. 2. Though specific embodiments to determine distance d are described, other methods of analyzing the coupled frequency responses $f_{c1}$ and $f_{c2}$ to determine distance d can be used.

Though specific values are shown in FIGS. 3A-3D, a frequency response can be over many time domain ranges and many magnitude ranges.

Figure 4:
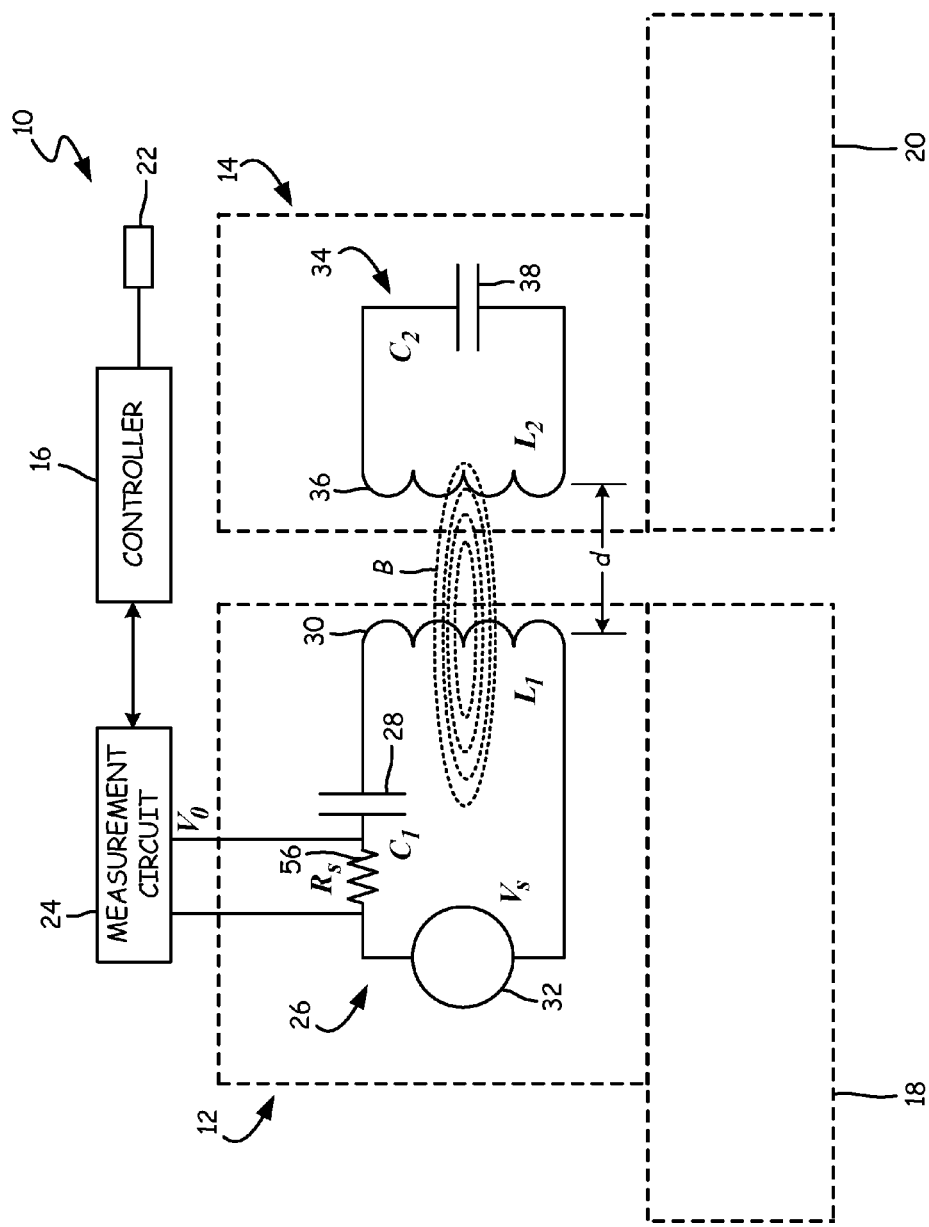
FIG. 4 is a schematic view of another embodiment of a proximity sensor system.

FIG. 4 is a schematic view of proximity sensor system 10a, which includes active sensor 12, passive target 14, controller 16, first structure 18, second structure 20, system components 22, and measurement circuit 24. Active sensor 12 includes active resonant tank circuit 26, which includes capacitor 28, inductor 30, excitation source 32, and current sense resistor 56. Passive target 14 includes passive resonant tank circuit 34, which includes capacitor 38 and inductor 36. Also shown in FIG. 1 are distance d and magnetic field B.

The components of sensor system 10a are connected consistently with those of sensor system 10 of FIG. 1, except for measurement circuit 24. Measurement circuit 24 is not physically connected to active object 18 and is not a component of active sensor 12. Additionally, measurement circuit 24 is electrically connected to active resonant tank circuit 26 across current sense resistor 56, which has a resistance $R_s$. However, measurement circuit 24 is still electrically connected to controller 16.

The components of sensor system 10a also operate consistently with those of sensor system 10, except that in this embodiment, measurement circuit 24 measures the current across current sense resistor 56. Current sense resistor 56 can be either a fixed or variable resistor that enables current measurement. This measurement allows for the electrical response generated by the magnetic coupling of active resonant tank circuit 26 and passive resonant tank circuit 34 to be analyzed in the frequency domain and time domain. In other embodiments, the current can be measured at other parts of active resonant tank circuit 26.

In one embodiment, controller 16 can control system components 22, which can be first structure 18 or second structure 20, based on the measured distance output from measurement circuit 24. Current measurement can also be accomplished by measuring the current through other components of active sensor 12.

Discussion of Possible Embodiments

The following are non-exclusive descriptions of possible embodiments of the present invention.

A proximity sensor includes an active sensor, a passive target, and a measurement circuit. The active sensor includes an active resonant tank circuit that includes an excitation source, a first capacitor, and a first inductor. The passive target includes a passive resonant tank circuit that includes a second capacitor and a second inductor, where magnetic coupling between the first inductor and the second inductor varies as a function of physical displacement of the first inductor and the second inductor with respect to one another. The measurement circuit is configured to measure a coupled resonant frequency response in the active resonant tank circuit and provide a measured distance output based on the coupled resonant frequency response.

The proximity sensor of the preceding paragraph can optionally include, additionally and/or alternatively, any one or more of the following features, configurations and/or additional components.

The active resonant tank circuit and the passive resonant tank circuit can be tuned to substantially equal resonant frequencies.

The active tank circuit can have a quality factor Q1 greater than one and the passive tank circuit can have a quality factor Q2 greater than one.

The active tank circuit and passive tank circuit can have a coefficient of coupling, and the coefficient of coupling can be at least as large as a critical coefficient of coupling between the active resonant tank circuit and the passive resonant tank circuit.

The coupled resonant frequency response can be determined by analyzing a voltage across a component of the active resonant tank circuit.

The coupled resonant frequency response can be determined by analyzing a current through the active resonant tank circuit.

The measurement circuit can determine a distance between the active sensor and the passive target by analyzing the coupled resonant frequency response versus a coefficient of coupling.

The measurement circuit can determine a distance between the active sensor and the passive target by analyzing the coupled resonant frequency response in a time domain versus a coefficient of coupling.

A proximity sensor system includes a proximity sensor and a controller. The proximity sensor includes an active sensor, a passive target, and a measurement circuit. The active sensor includes an active resonant tank circuit that includes an excitation source, a first capacitor, and a first inductor. The passive target includes a passive resonant tank circuit that includes a second capacitor and a second inductor, where magnetic coupling between the first inductor and the second inductor varies as a function of physical displacement of the first inductor and the second inductor with respect to one another. The measurement circuit is configured to measure a coupled resonant frequency response in the active resonant tank circuit and provide a measured distance output based on the coupled resonant frequency response. The controller is connected to the measurement circuit for controlling a system component based on the measured distance output.

The system of the preceding paragraph can optionally include, additionally and/or alternatively, any one or more of the following features, configurations and/or additional components.

The active resonant tank circuit and the passive resonant tank circuit can be tuned to substantially equal resonant frequencies.

The active tank circuit can have a quality factor Q1 greater than one and the passive tank circuit can have a quality factor Q2 greater than one.

The active tank circuit and the passive tank circuit can have a coefficient of coupling, and the coefficient of coupling can be at least as large as a critical coefficient of coupling between the active resonant tank circuit and the passive resonant tank circuit.

The measurement circuit can determine a distance between the active sensor and the passive target by analyzing one of the coupled resonant frequency response versus a coefficient of coupling or the coupled resonant frequency response in a time domain versus a coefficient of coupling.

A sensing object can attach the active sensor.

A target object can attach the passive target, and the target object and the sensing object can be movable with respect to one another.

The controller can control one of the sensing object or the target object based on the measured distance output.

A method of sensing proximity includes powering an active sensor, measuring a coupled resonant frequency response, and producing a measured distance output based on the electrical response. The active sensor is powered, which includes an active resonant tank circuit, and is magnetically coupled to a passive resonant tank circuit of a passive target. The magnetic coupling between the active resonant tank circuit and the passive resonant tank circuit varies as a function of physical displacement between the active and passive resonant tank circuits with respect to one another. A coupled resonant frequency response is measured in the active circuit that is a function of the magnetic coupling between the active resonant tank circuit and the passive resonant tank circuit. A measured distance output is produced based on the coupled resonant frequency response.

The method of the preceding paragraph can optionally include, additionally and/or alternatively, any one or more of the following features, configurations and/or additional components, or steps.

The active resonant tank circuit and the passive resonant tank circuit can be tuned to substantially equal resonant frequencies.

The measured distance output can be sent to a controller.

A system component can be controlled based on the measured distance output.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A proximity sensor comprising:
    an active sensor comprising an active electrical resonant tank circuit that includes an excitation source, a first capacitor, and a first inductor;
    a passive target comprising a passive electrical resonant tank circuit that includes a second capacitor and a second inductor, wherein magnetic coupling between the first inductor and the second inductor varies as a function of separation distance between the first inductor and the second inductor in parallel with the second capacitor; and
    a measurement circuit configured to measure an analog value of the coupled resonant frequency response in the active electrical resonant tank circuit and provide a measured distance output based on the analog value of the coupled resonant frequency response, wherein the analog value of the coupled resonant frequency response varies as a function of the separation distance;
    wherein the active electrical resonant tank circuit has a quality factor Q1 greater than one and the passive electrical resonant tank circuit has a quality factor Q2 greater than one; and
    wherein the measured distance output is a signal that represents the separation distance.

2. The proximity sensor of claim 1, wherein the active electrical resonant tank circuit and the passive electrical resonant tank circuit are tuned to substantially equal resonant frequencies.

3. The proximity sensor of claim 1, wherein the active electrical resonant tank circuit and passive electrical resonant tank circuit have a coefficient of coupling, and wherein the coefficient of coupling is at least as large as a critical coefficient of coupling between the active electrical resonant tank circuit and the passive electrical resonant tank circuit.

4. The proximity sensor of claim 3, wherein the coefficient of coupling is greater than the critical coefficient of coupling between the active electrical resonant tank circuit and the passive electrical resonant tank circuit.

5. The proximity sensor of claim 1, wherein the coupled resonant frequency response is determined by analyzing a voltage across a component of the active electrical resonant tank circuit.

6. The proximity sensor of claim 1, wherein the coupled resonant frequency response is determined by analyzing a current through the active electrical resonant tank circuit.

7. The proximity sensor of claim 1, wherein the measurement circuit determines a distance between the active sensor and the passive target by analyzing the coupled resonant frequency response versus a coefficient of coupling.

8. The proximity sensor of claim 1, wherein the measurement circuit determines a distance between the active sensor and the passive target by analyzing the coupled resonant frequency response in a time domain versus a coefficient of coupling.

9. A proximity sensor system comprising:
    a proximity sensor comprising:
        an active sensor comprising an active electrical resonant tank circuit that includes an excitation source, a first capacitor, and a first inductor;
        a passive target comprising a passive electrical resonant tank circuit that includes a second capacitor and a second inductor in parallel with the second capacitor, wherein magnetic coupling between the first inductor and the second inductor varies as a function of separation distance between the first inductor and the second inductor; and a measurement circuit configured to measure an analog value of the coupled resonant frequency response in the active electrical resonant tank circuit and provide a measured distance output based on the analog value of the coupled resonant frequency response, wherein the analog value of the coupled resonant frequency response varies as a function of the separation distance; and a controller connected to the measurement circuit for controlling a system component based on the measured distance output; and wherein the active electrical resonant tank circuit and passive electrical resonant tank circuit have a coefficient of coupling, and wherein the coefficient of coupling is greater than a critical coefficient of coupling between the active electrical resonant tank circuit and the passive electrical resonant tank circuit; and wherein the measured distance output is a signal that represents the separation distance.

10. The proximity sensor system of claim 9, wherein the active electrical resonant tank circuit and the passive electrical resonant tank circuit are tuned to substantially equal resonant frequencies.

11. The proximity sensor system of claim 9, wherein the active electrical tank circuit has a quality factor Q1 greater than one and wherein the passive electrical tank circuit has a quality factor Q2 greater than one.

12. The proximity sensor system of claim 9, wherein the measurement circuit determines a distance between the active sensor and the passive target by analyzing one of the coupled resonant frequency response versus a coefficient of coupling or the coupled resonant frequency response in a time domain versus a coefficient of coupling.

13. The proximity sensor system of claim 9 and further comprising a sensing object for attaching the active sensor.

14. The proximity sensor system of claim 13 and further comprising a target object for attaching the passive target, wherein the target object and the sensing object are movable with respect to one another.

15. The proximity sensor system of claim 14, wherein the controller controls one of the sensing object or the target object based on the measured distance output.

16. A method of determining separation distance between a first inductor and a second inductor, the method comprising:

powering an active sensor comprising an active electrical resonant tank circuit which is magnetically coupled to a passive electrical resonant tank circuit of a passive target, and wherein the magnetic coupling between the active electrical resonant tank circuit and the passive electrical resonant tank circuit varies as a function of separation distance between the active and passive electrical resonant tank circuits;

maintaining a quality factor Q1 of greater than one for the active electrical resonant tank circuit and a quality factor Q2 greater than one for the passive electrical resonant tank circuit;

measuring an analog value of the coupled resonant frequency response in the active electrical resonant tank circuit that is a function of the magnetic coupling between the active electrical resonant tank circuit and the passive electrical resonant tank circuit, wherein the analog value of the coupled resonant frequency response varies as a function of the separation distance; and producing a measured distance output based on the analog value of the coupled resonant frequency response, wherein the measured distance output is a signal that represents the separation distance;

wherein the passive electrical resonant tank circuit is comprised of a second capacitor in parallel with a second inductor.

17. The method of determining separation distance of claim 16, wherein the active electrical resonant tank circuit and the passive electrical resonant tank circuit are tuned to substantially equal resonant frequencies.

18. The method of determining separation distance of claim 16 including:

sending the measured distance output to a controller.

19. The method of determining separation distance of claim 17 including:

controlling a system component based on the measured distance output.

20. The method of determining separation distance of claim 16 and further including:

maintaining a coefficient of coupling between the active electrical resonant tank circuit and the passive electrical resonant tank circuit that is greater than a critical coefficient of coupling between the active electrical resonant tank circuit and the passive electrical resonant tank circuit.

* * * * *